United States Patent [19]

Scovell

[11] Patent Number: 4,490,183
[45] Date of Patent: Dec. 25, 1984

[54] METHOD OF REACTIVATING IMPLANTED DOPANTS AND OXIDATION SEMICONDUCTOR WAFERS BY MICROWAVES

[75] Inventor: Peter D. Scovell, Chelmsford, England

[73] Assignee: ITT Industries, Inc., New York, N.Y.

[21] Appl. No.: 413,327

[22] Filed: Aug. 31, 1982

[30] Foreign Application Priority Data

Sep. 17, 1981 [GB] United Kingdom ............... 8128127

[51] Int. Cl.³ .................. H01L 21/263; H05B 9/03; C23C 11/00
[52] U.S. Cl. .................................. 148/1.5; 29/576 B; 29/576 T; 219/10.55 A; 219/10.55 M; 357/91; 427/45.1
[58] Field of Search ........... 148/1.5; 29/576 B, 576 T; 219/10.55 A, 10.55 M; 357/91; 427/45.1, 53.1

[56] References Cited

U.S. PATENT DOCUMENTS

| | | | |
|---|---|---|---|
| 4,140,887 | 2/1979 | Sutton et al. ............... | 219/10.55 M |
| 4,151,058 | 4/1979 | Kaplan et al. .............. | 148/1.5 |
| 4,181,538 | 1/1980 | Narayan et al. ............ | 148/1.5 |
| 4,273,950 | 6/1981 | Chitre ....................... | 136/255 |
| 4,298,629 | 3/1981 | Nozaki et al. .............. | 427/45.1 |
| 4,303,455 | 12/1981 | Splinter et al. ........... | 148/1.5 |
| 4,314,128 | 2/1982 | Chitre ....................... | 219/10.55 M |
| 4,323,745 | 4/1982 | Berggren ................... | 219/10.55 M |
| 4,324,965 | 4/1982 | Naumann et al. .......... | 219/10.55 A |
| 4,339,648 | 7/1982 | Jean .......................... | 219/10.55 A |
| 4,401,054 | 8/1983 | Matsuo et al. ............. | 427/45.1 |

OTHER PUBLICATIONS

Powell et al., Appl. Phys. Letts. 39, (Jul. 1981), 150.

Primary Examiner—Upendra Roy
Attorney, Agent, or Firm—Donald J. Lenkszus

[57] ABSTRACT

Dopants in semiconductor bodies which have been deactivated during processing are reactivated by pulse heating the body to a temperature within the region in which the semiconductor sheet resistivity decreases with increasing anneal temperature. Typically this comprises raising the body to 1000° C. within 40 seconds or less in an inert atmosphere and allowing it to cool immediately or within approximately 30 seconds. The heating is so rapid that diffusion side effects are minimized. Pulse heating may be achieved by means of a sealable microwave heating chamber (1) which can be pressurized or vented as desired and into which microwave energy is directed for a predetermined time. The microwave heating can also be employed for other processing, particularly high pressure oxidation of silicon.

7 Claims, 1 Drawing Figure

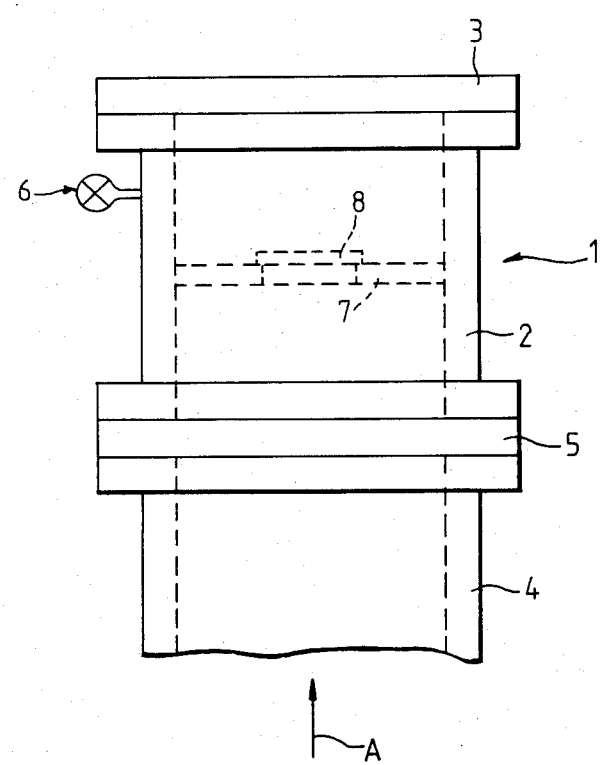

METHOD OF REACTIVATING IMPLANTED DOPANTS AND OXIDATION SEMICONDUCTOR WAFERS BY MICROWAVES

This invention relates to semiconductor processing and in particular processing involving heating of a semiconductor material.

According to one aspect of the present invention there is provided a method of reactivating a dopant in a semiconductor body, which has been deactivated during processing, including the step of pulse heating the body to a temperature within the region in which the semiconductor sheet resistivity decreases with increasing anneal temperature.

According to another aspect of the present invention there is provided a semiconductor processing apparatus including a sealable chamber comprised by a length of microwave waveguide, window means for the passage of microwaves into the chamber in the direction of the axis of the waveguide, means for controlling the ambient atmosphere within the chamber and semiconductor wafer support means mounted in the chamber.

According to a further aspect of the present invention there is provided a method of processing a semiconductor body including arranging the body in a sealable chamber comprised by a length of microwave waveguide, adjusting the ambient atmosphere in the chamber to that appropriate for a particular process and pulse heating the body by directing microwaves into the chamber for a predetermined time.

Embodiments of the invention will now be described with reference to the accompanying drawing which is a schematic diagram of a semiconductor oxidation apparatus employing high pressures and microwave heating.

In the copending Application Ser. No. 195,688, filed Oct. 9, 1980, there is described a process and apparatus for annealing ion implantation damage in semiconductor bodies. The process involves annealing by pulse heating an ion damaged semiconductor body to a temperature range within which the sheet resistivity of the ion implanted body falls to a low value. The sheet resistivity of an arsenic ion, for example, implanted layer in a silicon body is not a linear function of the annealing temperature, but has a definite minimum value at a temperature between 450° and 600° C. The sheet resistivity shows a slow rise with increasing anneal temperature up to about 750° C. and then falls again to 800° to 900° C., this latter temperature being an example of that employed in previously conventional annealing processes. The process disclosed in the copending application involves a rapid excursion to the annealing temperature, for example, heating the body to 500° C. within 20 to 30 seconds and maintaining it at 500° C. for 30 seconds (pulse heating), or alternatively heating the body rapidly to 700° C. and immediately allowing it to cool (triangular pulse). The former pulse heating method was found to be sufficient to anneal ion implanted silicon wafers except those with partially damaged surface layers, whereas the latter method was found to be sufficient to regrow a damaged surface layer and activate the implanted arsenic. Those pulse heating methods provided effective annealing in a far shorter period and at lower temperatures than the then conventional high temperature furnace techniques, thus also avoiding undesirable diffusion of the ion implanted or other dopants, if any. In a specific example a number of initially 30 ohm cm single crystal silicon wafers, were bombarded with arsenic ions at an energy of 150 KeV to produce a sub-surface doping level of $6 \times 10^{15}$ cm$^{-2}$. A set of these wafers was treated to a conventional furnace annealing process involving heating at 650° C. for 30 minutes. The resultant sheet resistivity, indicative of the efficiency of the annealing process, was 39.3±0.2 ohms per square. Another set of wafers was pulse heated to 600° C. for 30 seconds and had a resultant sheet resistivity of 30.8±0.2 ohms per square. The pulse heating employs temperatures in the region where the semiconductor sheet resistivity has a minimum value, that is the "low temperature" minimum.

I have now found that by employing similar pulse heating treatment but at higher temperatures I can reactivate dopants which have become deactivated as a result of thermal processing steps employed after the initial annealing was performed to repair ion implantation damage. Such deactivation is a phenomenon which occurs with any low temperature process. It is, however, desirable to use low temperatures in order to minimise in-diffusion of dopants when making small geometry devices and these low temperatures result in deactivation problems. Thus reactivation of the dopant, which has the effect of reducing the sheet resistivity of the doped layers, is very important.

The following example illustrates the present invention. A silicon body implanted with 150 KeV arsenic ions to a sub-surface doping level of $6 \times 10^{15}$ cm$^{-2}$ was annealed with a 700° C. triangular heat pulse as in the co-pending application, resulting in a sheet resistivity of 34 ohms per square. After deactivating the layer by means of a 100 hour anneal at 700° C. in a conventional furnace, to simulate further processing, the sheet resistivity becomes 62 ohms per square. The dopant was reactivated by pulse heating to 1000° C., being heated to that temperature within 40 seconds or less and allowed to cool immediately or after approximately 30 seconds, with a resultant sheet resistivity of 26 ohms per square. The heat pulse causes heating to a temperature in the region in which the semiconductor sheet resistivity decreases with increasing anneal temperature, in contrast to the "low-temperature" minimum value employed for the annealing.

Other dopants can be activated, for example phosphorus implanted at an energy of 70 KeV to a dose of $6 \times 10^{15}$ ions cm$^{-2}$ resulted in a sheet resistivity of 19 ohms per square and antimony implanted at an energy of 200 KeV to a dose of $6 \times 10^{15}$ ions cm$^{-2}$ yielded a sheet resistivity of 31 ohms per square. Similarly boron ions implanted at an energy of 100 KeV and to a dose of $6 \times 10^{15}$ ions cm$^{-2}$ gave a resistivity of 18 ohms per square. In all cases, the peak temperature was approximately 1000° C. and all measured resistivities were lower than those obtained after conventional furnace annealing at 800° C.

Because the reactivation process is of short duration little difusion takes place and this is entirely compatible with present day low temperature processes (typically 850° C.) where diffusion is minimised. The reactivation process is particularly beneficial to semiconductor processing by virtue of its minimising the resistivity of highly doped regions.

The high pulsed temperatures for reactivation can be achieved by means of strip or radiant heaters arranged in chambers adapted to surround the semiconductor bodies with an inert gas during the pulsed heating step, as described in the co-pending application for annealing purposes but suitably modified. Alternatively microwave pulse heating means as described hereinafter may be employed.

A conventional high pressure silicon oxidation apparatus comprises a conventional furnace tube arranged in a high pressure vessel. This is thus a very expensive and cumbersome piece of equipment. However high pressure oxidation has the following advantages in that the processing can be completed quickly, there is smaller sideways oxidation encroachment than for one atmosphere oxidation at equivalent temperatures, and there is less oxidation induced stacking fault growth than for one atmosphere oxidation at equivalent temperatures.

I have found that short thermal pulses can be used to oxidise silicon in high pressure oxygen. This can be achieved by employing a high pressure microwave waveguide (for example 20 atmospheres) as the oxidation chamber and pulse heating silicon wafers therein by microwaves. The wafers are heated by virtue of the microwaves being absorbed by the wafers as in the conventional eddy current heating and the heating effect can also be enhanced by direct absorption of the microwaves into any doped layer previously introduced into the back of the wafers, the microwaves being directed through the wafer, with the wafer arranged on a quartz or similar dielectric or semi-metallic support as described hereinafter, all surfaces of the wafer being oxidised. The direct absorption is by means of free carrier absorption.

A microwave pulse heated high pressure oxidation system is shown schematically in the accompanying drawing. An oxidation chamber 1 is comprised by a length of, typically circular cross-sectioned, waveguide 2 closed at one end by a pressure seal 3. The other end of the waveguide 3 is connected to a waveguide 4 of corresponding cross-section with an alumina window 5, which is transparent to microwaves, interposed therebetween in order to provide a pressure seal at the other end of waveguide 2. The oxidation chamber 1 is provided with pressure valve and vent means, shown schematically at 6, whereby to introduce gases into and/or vent gases from the chamber. A quartz or similar dielectric or semi-metallic wafer holder 7, which may be apertured as shown, is mounted in the chamber 1, a wafer 8 being shown in position thereon. For wafer loading and unloading purposes the pressure seal 3 is demountable. Microwaves from a source (not shown) are guided by waveguide 4 in the direction of arrow A to the chamber 1 where they serve to heat wafers therein. The wavelength of the microwaves employed and the power thereof is chosen to produce the required temperatures and they are transmitted for the required pulse heating time. Preferably the $H_{1,1}$ mode of propagation is employed, the cavity (chamber) is cylindrical and the radiation is circularly polarised. This provides uniformity of heating for circular wafers.

In the case of oxidation of silicon wafers, oxygen under pressure, for example 20 atmosphere, is supplied to the chamber 1 via valve means 6 after location of silicon wafers on the quartz or similar dielectric or semi-metallic holder 7, closure of the chamber and venting thereof. Typically at high pressures of oxygen (20 atmospheres) a gate oxide 150 Å thick can be grown in approximately one minute at 1000° C. by using such microwave pulse heating.

Microwave heating has various advantages. In particular, direct coupling of energy into the wafers which means rapid heating of the wafers. In a conventional furnace and at low furnace temperatures there is inefficient coupling of infra-red radiation from the walls of the furnace tube into the wafers. As a result, wafers take a long time to reach the required temperature in a conventional furnace system. We have measured the rise of temperature of a 3 inch diameter wafer in a 700° C. furnace and found that it takes 13 minutes to reach 95% of the furnace temperature.

Another advantage is that the walls of a waveguide system remain cold. This minimises the risk of contamination of the wafer by impurities in the walls; a common problem with conventional systems.

Since the wafer can be heated quickly, the time of the oxidation can be controlled very accurately. This is particularly important, for example, when growing thin (150 Å) gate oxides for 1 μm MOS devices where the oxide thickness has to be controlled to better than 15 Å. Presently oxidation thickness is variable (± a hundred Å) because despite loading the wafers into a furnace tube with an inert gas flowing down the tube, back streaming of air occurs which grows a variable and uncertain thickness of oxide prior to switching the gas over to oxygen.

The same basic apparatus may be employed for other purposes by changing the ambient within the chamber. In particular if the ambient is an inert gas or vacuum the process of pulsed thermal annealing as described in the co-pending application, or dopant reactivation by pulse heating as described above, can be performed therein. Other possibilities of use of the apparatus include low pressure chemical vapour deposition of silicon nitride, silicon dioxide, polycrystalline silicon or aluminium, and epitaxial deposition of silicon. In all of these processes the microwave heating will enable the process step to be performed quickly and reliably. The heating apparatus is reduced in size and cost relevant to conventional high pressure furnace systems.

What is claimed is:
1. A method of oxidizing a silicon body including:
   arranging the body in a sealable chamber comprising a length of microwave waveguide;
   introducing an oxygen ambient atmosphere at a pressure of approximately 20 atmospheres in the chamber; and
   pulse heating the body by directing microwaves into said chamber for a predetermined time.
2. A method in accordance with claim 1, wherein: during said pulse heating step said body is heated to approximately 1000° C. to grow an oxide layer of the order of 150 Å thick in approximately one minute.
3. A method as claimed in claims 1 or 2, wherein the semiconductor body is provided with a doped layer which is such as to directly absorb the microwaves and enhance the heating effect thereof.
4. A method in accordance with claim 1, wherein said microwaves are directed through said wafer.
5. A method in accordance with claim 1, wherein the $H_{1,1}$ mode of propagation of said microwaves is used.
6. A method in accordance with claim 5, wherein said microwaves are circularly polarized.
7. A method in accordance with claim 6, wherein said waveguide is cylindrical.

* * * * *